United States Patent
Park et al.

(10) Patent No.: US 9,543,348 B2
(45) Date of Patent: Jan. 10, 2017

(54) BACKLIGHT IMAGE SENSOR CHIP HAVING IMPROVED CHIP DRIVING PERFORMANCE

(71) Applicant: SILICONFILE TECHNOLOGIES INC., Gyeonggi-do (KR)

(72) Inventors: Kyoung-Sik Park, Gyeonggi-do (KR); Heui Gyun Ahn, Gyeonggi-do (KR); Min-Suk Ko, Gyeonggi-do (KR); Gab-Hwan Cho, Gyeonggi-do (KR)

(73) Assignee: SILICONFILE TECHNOLOGIES INC., Gyeonggi-do (KR)

( * ) Notice: Subject to any disclaimer, the term of this patent is extended or adjusted under 35 U.S.C. 154(b) by 0 days.

(21) Appl. No.: 14/912,373

(22) PCT Filed: Aug. 12, 2014

(86) PCT No.: PCT/KR2014/007504
§ 371 (c)(1),
(2) Date: Feb. 16, 2016

(87) PCT Pub. No.: WO2015/023115
PCT Pub. Date: Feb. 19, 2015

(65) Prior Publication Data
US 2016/0204157 A1    Jul. 14, 2016

(30) Foreign Application Priority Data
Aug. 14, 2013 (KR) .................. 10-2013-0096910

(51) Int. Cl.
*H01L 31/0232* (2014.01)
*H01L 27/146* (2006.01)

(52) U.S. Cl.
CPC ....... *H01L 27/1464* (2013.01); *H01L 27/1469* (2013.01); *H01L 27/14634* (2013.01); *H01L 27/14636* (2013.01); *H01L 27/14621* (2013.01); *H01L 27/14627* (2013.01)

(58) Field of Classification Search
CPC ................ H01L 27/14621; H01L 27/14627; H01L 27/1464; H01L 27/14636
USPC ............................................. 257/432
See application file for complete search history.

(56) References Cited

U.S. PATENT DOCUMENTS

2011/0207258 A1*  8/2011  Ahn ............. H01L 21/6835
                                         438/70

FOREIGN PATENT DOCUMENTS

| JP | 06-152861 | 5/1994 |
|---|---|---|
| JP | 2012-015129 | 1/2012 |
| KR | 1020100079249 | 7/2010 |
| KR | 1020100119860 | 11/2010 |
| KR | 1020110096275 | 8/2011 |

* cited by examiner

Primary Examiner — Theresa T Doan
(74) Attorney, Agent, or Firm — IP & T Group LLP

(57) ABSTRACT

The present invention relates to a backlight image sensor chip having improved chip driving performance, in which a region other than a pad region, on which a conductive pad is formed, and a sensing region, on which an optical filter is formed, is used as a region for auxiliary driving so that additional functions such as auxiliary power supply, auxiliary signal transmission and auxiliary operation control can be performed, without additional process, in the backlight image sensor chip having a restricted area, thereby improving the chip driving performance.

12 Claims, 4 Drawing Sheets

BACKLIGHT IMAGE SENSOR CHIP HAVING IMPROVED CHIP DRIVING PERFORMANCE

This application is a national stage application of PCT/KR2014/007504 filed on Aug. 12, 2014, which claims priority of Korean patent application number 10-2013-0096910 filed on Aug. 14, 2013. The disclosure of each of the foregoing applications is incorporated herein by reference in its entirety.

TECHNICAL FIELD

The present invention relates to an image sensor technique, and more specifically, to a backlight image sensor chip having an improved chip driving performance.

BACKGROUND ART

In Korean Patent Publication No. 10-2011-0096275, published on Aug. 30, 2011, which is applied by applicant of the present invention, a method for forming a pad of a wafer having three dimensional structure, which is implemented through a simple manner without a damage of a silicon substrate surface and a super contact, by forming an insulation layer without performing a process for etching a separate silicon substrate after a back side thinning process of an element wafer, forming a via on a back side of the super contact, and forming a pad on a back side of the via, was proposed.

In case of a backlight image sensor chip acquired from a wafer, which is manufactured by using a method for forming a pad of a wafer having a conventional three dimensional structure, a region between a pad region in which a pad is formed and a sensing region in which an optical filter is formed is not used.

Thus, inventors of the present invention have developed a technique for improving a chip driving performance of a backlight image sensor chip having a restricted area without an additional process by using a region that excludes the pad region in which the pad of the backlight image sensor chip is formed and the sensing region in which the optical filter is formed, as an auxiliary driving region.

DISCLOSURE

Technical Problem

The present invention is directed to a backlight image sensor chip for improving a chip driving performance of a backlight image sensor chip having a restricted area without an additional process by using a region, which excludes a pad region in which a conductive pad of a backlight image sensor chip is formed and the sensing region in which the optical filter is formed, as an auxiliary driving region.

Technical Solution

In accordance with an embodiment of the present invention, a semiconductor device

Advantageous Effects

The present invention may improve a chip driving performance since an additional function such as an auxiliary power supply, an auxiliary signal transmission and an auxiliary operation control in a backlight image sensor chip having a restricted area without an additional process is performed by using a region, which excludes a pad region in which a conductive pad of a backlight image sensor chip is formed and the sensing region in which the optical filter is formed, as an auxiliary driving region.

BEST MODE

Hereinafter, various embodiments will be described below in more detail with reference to the accompanying drawings such that a skilled person in this art understand and implement the present invention easily.

In the descriptions of the present invention, the detailed descriptions will be omitted in case that the detailed descriptions related to the published configurations or functions blur the gist of embodiments of the present invention unnecessarily.

Since specific terms used in this specification of the present invention are terms, which are defined according to the functions of the embodiments of the present invention, and may be changed fully according to the purpose or custom of a user or an operator, the definition of the terms is determined based on the contests considered in the specification of the present invention.

Figure 1:
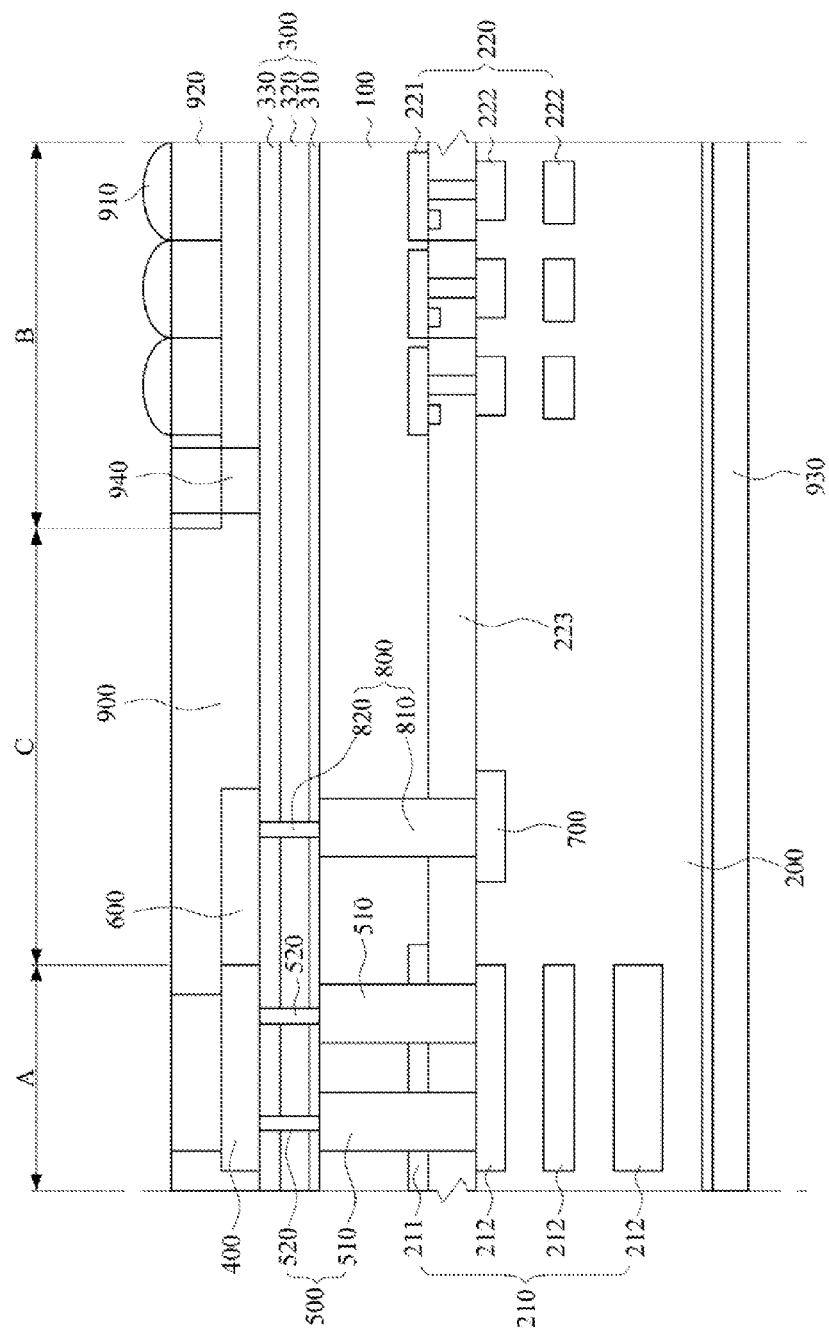
FIG. 1 is a cross sectional view illustrating a backlight image sensor chip having an improved chip driving performance in accordance with a first embodiment of the present invention.
Figure 2:
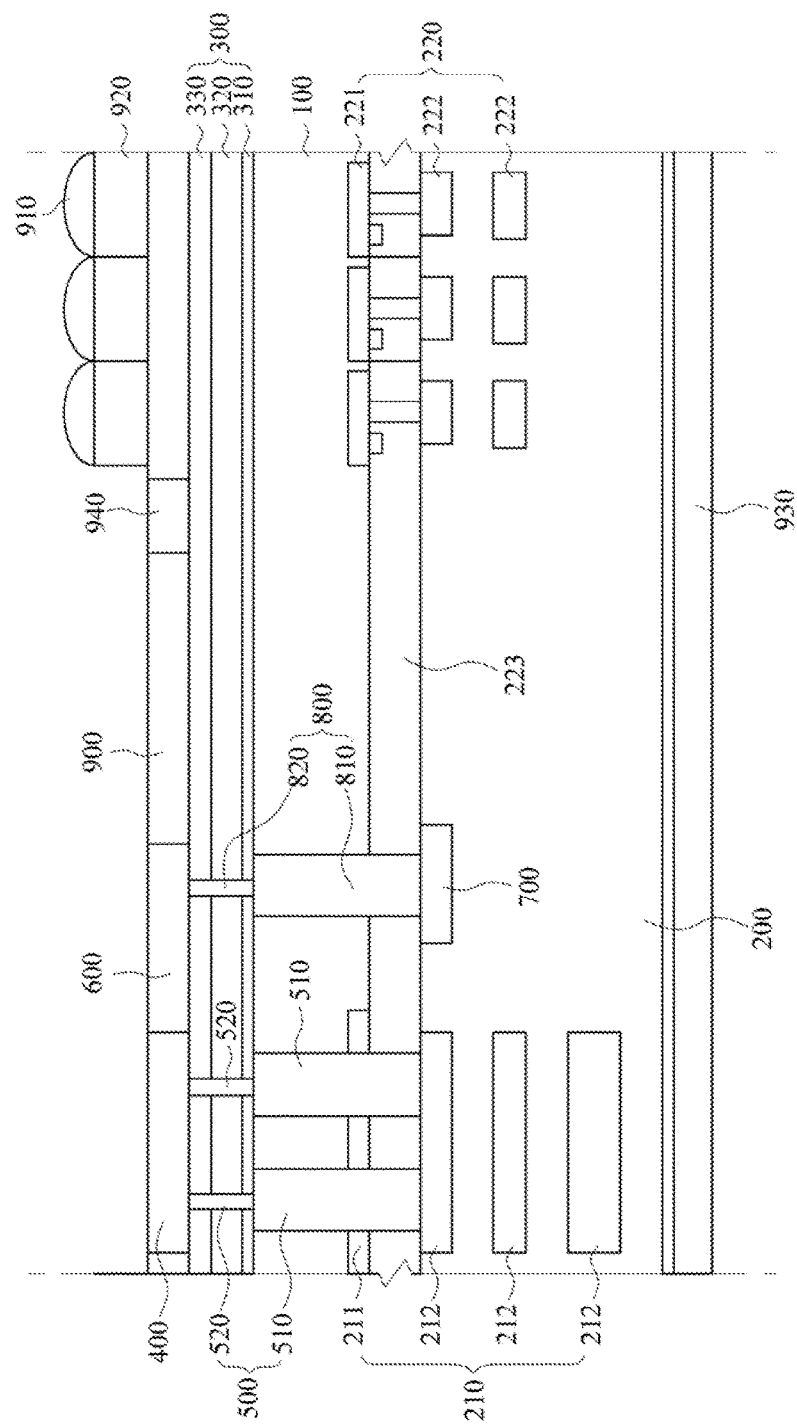
FIG. 2 is a cross sectional view illustrating a backlight image sensor chip having an improved chip driving performance in accordance with a second embodiment of the present invention.

FIG. 1 is a cross sectional view illustrating a backlight image sensor chip having an improved chip driving performance in accordance with a first embodiment of the present invention, and FIG. 2 is a cross sectional view illustrating a backlight image sensor chip having an improved chip driving performance in accordance with a second embodiment of the present invention.

As shown in FIGS. 1 and 2, a backlight image sensor chip having an improved chip driving performance in accordance with embodiments of the present invention includes a semiconductor substrate 100, an element stacked unit 200, an insulation multi-layer 300, a conductive pad 400, a coupling unit 500, at least one routing metal 600, at least one auxiliary driving unit 700 and an auxiliary coupling unit 800.

The semiconductor substrate 100 may be a silicon substrate having a thickness of 2-6 µm and be formed by a back side thinning process of the element stacked unit 200, which is formed on a front side.

The element stacked unit 200 is formed on a front side of the semiconductor substrate 100, and includes a semiconductor circuit module 210 including a peripheral circuit 211 and a metal distribution line 212, an image sensor module including a photodiode 221 and a metal distribution line 222, and an interlayer insulation layer 230 for an electrical insulation from the semiconductor substrate 100. Herein, the metal distribution line 212 and the metal distribution line 222 are electrically coupled to each other.

The insulation multi-layer 300 is formed on a back side of the semiconductor substrate 100, and electrically insulates the semiconductor substrate 100 from a material (the conductive pad 400 and the routing metal) stacked on a back side of the insulation multi-layer 300.

For example, the insulation multi-layer 300 may include an anti-reflection layer 310 where an Oxynitride or Oxide-Nit-Oxide is deposited on the back side of the semiconductor substrate 100 within a thickness of 500 Å, a preferential metal deposition (PDM) dielectric layer 320 is deposited on the back side of the anti-reflection layer 310 with a thickness of 1000 Å to 5000 Å, and an insulation layer 330 of an oxide element stacked on the back side of the PDM dielectric layer 320.

The conductive pad 400 is formed on a portion of the back side of the insulation multi-layer 300, and may be formed of a metal such as an aluminum (Al) or at least two metal alloys. A main power is supplied or a main signal is transmitted or received through the conductive pad 400.

The coupling unit 500 is electrically coupled between the conductive pad 400 and the circuit module 210 of the element stacked unit 200, and may be a metal via composed of a tungsten (W).

The coupling unit 500 may include a first coupling unit 510, which is electrically coupled to the peripheral circuit 211 and the metal distribution line 212 of the semiconductor circuit module 210 of the element stacked unit 200, and a second coupling unit 520, which is electrically coupled between the first coupling unit 510 and the conductive pad 400.

The at least one routing metal 600 is formed in a region of a same layer as the conductive pad, and is electrically coupled to the conductive pad 400. Herein, a region C indicates a region except a pad region A on the conductive pad 400 is formed and a sensing region B on which an optical filter 920. Meanwhile, the at least one routing metal 600 may be composed of the aluminum (Al) or the tungsten (W).

The at least one auxiliary driving unit 700 is formed in the element stacked unit 200 or the insulation multi-layer 300, and performs an additional function such as an auxiliary power supply, an auxiliary signal transmission and an auxiliary operation control.

For example, the at least one auxiliary driving unit 700 may be at least one auxiliary power supply line for an auxiliary power supply. In another embodiment, the at least one auxiliary driving unit 700 may be at least one auxiliary signal transmission line for an auxiliary signal transmission. In another embodiment, the auxiliary driving unit 700 may be an active transistor such as a diode and a transistor for an auxiliary operation control, or a passive element such as a resistor, an inductor and a capacitor.

The auxiliary coupling unit 800 is electrically coupled between the at least one routing metal 600 and the at least one auxiliary driving unit 700 and may be a metal via composed of tungsten.

Herein, the auxiliary coupling unit 800 may be implemented through a first auxiliary coupling unit 810, which is electrically coupled to the at least one auxiliary driving unit 700, and a second auxiliary coupling unit 820, which is electrically coupled between the first auxiliary coupling unit 810 and the routing metal 600.

By this implementation, the main power supply or the main signal transmission is performed to the semiconductor circuit module 210 of the element stacked unit 200, and the image sensor module 220, which is electrically coupled to the semiconductor circuit module 210.

Differently from this, an auxiliary operation control f a separate active element or passive element is performed or the auxiliary power supply or the auxiliary signal transmission is performed to the auxiliary driving unit 700 through the at least one routing metal 600 of a same layer which is electrically coupled to the conductive pad 400, and the auxiliary coupling unit 800.

Herein, if the auxiliary power supply or the auxiliary signal transmission is performed to the auxiliary driving unit 700, the auxiliary power supply or the auxiliary signal transmission may be performed to the semiconductor circuit module 210 of the element sensor stacked unit 200, which is electrically coupled to the auxiliary driving unit 700, and the image sensor module 220, which is electrically coupled to the semiconductor circuit module 210.

Thus, the present invention may improve the chip driving performance since the additional function such as the auxiliary power supply, the auxiliary signal transmission and an auxiliary operation control in a backlight image sensor chip having the restricted area without the additional process is performed by using the region, which excludes the pad region in which the conductive pad of the backlight image sensor chip is formed and the sensing region in which the optical filter is formed, as an auxiliary driving region.

Meanwhile, in accordance with another aspect of the present invention, the routing metal 600 has a multi-layer structure, each layer of the routing metal 600 is electrically coupled to each other through a via 610 composed of the tungsten (W), at least one layer of the routing metal 600 may be electrically coupled to the at least one auxiliary driving unit 700 through the auxiliary coupling unit 800.

Figure 3:
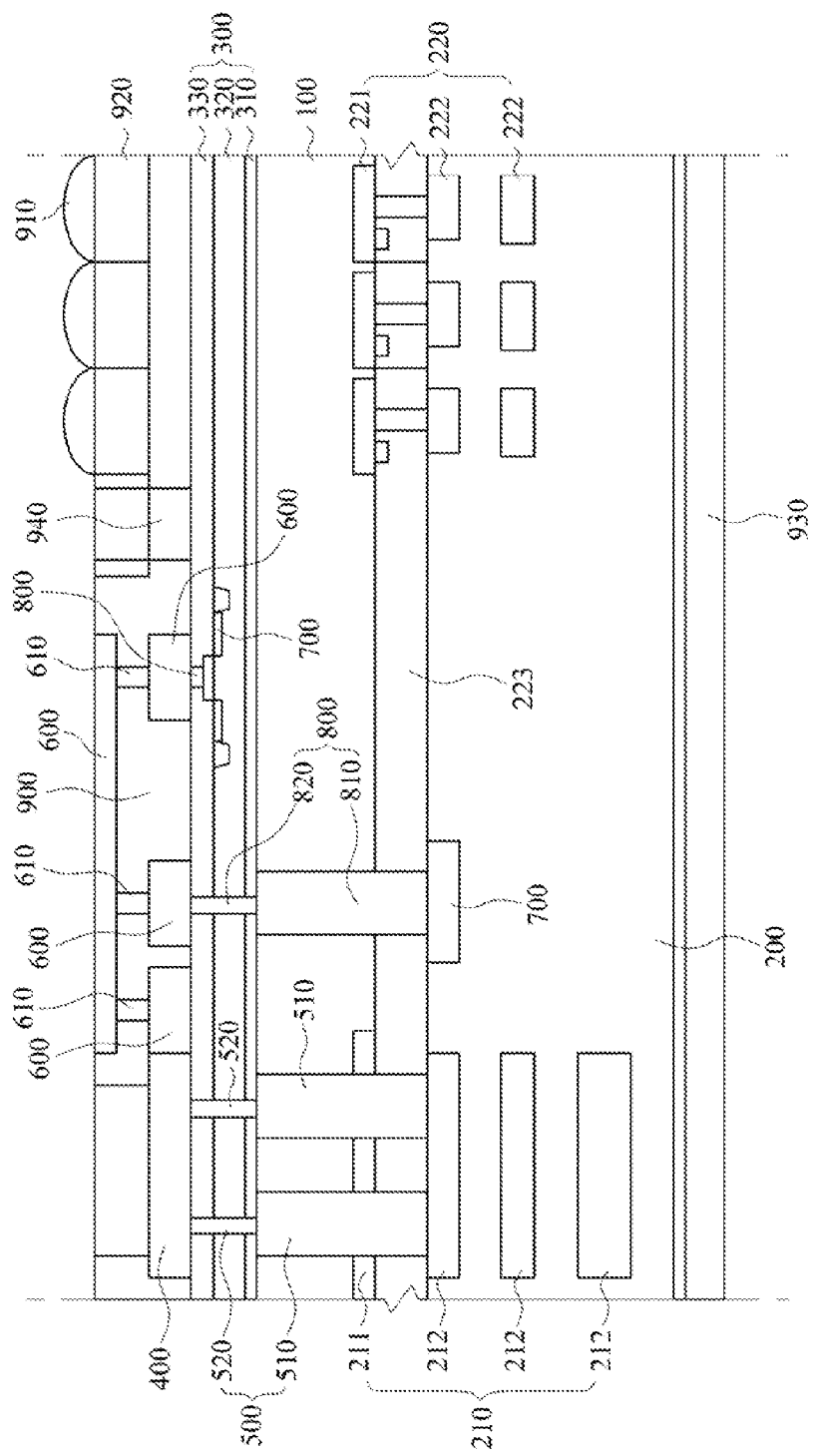
FIG. 3 is a cross sectional view illustrating a backlight image sensor chip having an improved chip driving performance in accordance with a third embodiment of the present invention.

FIG. 3 is a cross sectional view illustrating a backlight image sensor chip having an improved chip driving performance in accordance with a third embodiment of the present invention. Referring to FIG. 3, the routing metal 600 of a same layer, which is electrically coupled to the conductive pad 400 and a different routing metal of a different layer are disposed to have a multi-layer.

Meanwhile, in accordance with another aspect of the present invention, the backlight image sensor chip having the improved chip driving performance may further include a dielectric layer 900. The dielectric layer 900 is stacked on a back side of the insulation multi-layer 300, and protects and supports the conductive pad 400 and the routing metal 600.

As shown in FIG. 1, the conductive pad 400 and the routing pad 600 is formed on a portion of the back side of the insulation multi-layer 300, and a dielectric material of oxide series or nitride series is deposited on the back side of the insulation layer 300 such that the conductive pad 400 and the routing metal 600 are buried, and then, the dielectric layer 900 is formed by forming a pad open region through a pad open process.

Differently from this, as shown in FIG. 2, the conductive pad 400 and the routing metal 600 is formed on a portion of the insulation multi-layer 300, and a dielectric material of oxide series or nitride series is deposited on the back side of the insulation layer 300 such that the conductive pad 400 and the routing metal 600 are buried, and then, the dielectric layer 900 may be formed by performing a planarization process.

Meanwhile, in accordance with another aspect of the present invention, the backlight image sensor chip having the improved chip driving performance may further include a micro-lens 910 and an optical filter 920. The micro-lens concentrates a light. The optical filter 920 passes a specific frequency band of the light, which is concentrated by the micro-lens.

The light having the specific frequency band which is passed through the optical filter 920 is detected by the photodiode 221 included in the image sensor module 220 of the element stacked unit 200, and a detected light signal is converted into an electric signal.

Meanwhile in accordance with another aspect of the present invention, the backlight image sensor chip having the improved chip driving performance may further include a handling substrate 930. The handling substrate 930 is formed on the front side of the element stacked unit, and prevents the element stacked unit 200 from being damaged.

Meanwhile, a metal shield 940 shown in FIG. 3 electrically and thermally shields a pad region A in which the conductive pad 400 is formed and a sensing region B in which the optical filter 920 is formed.

Figure 4:
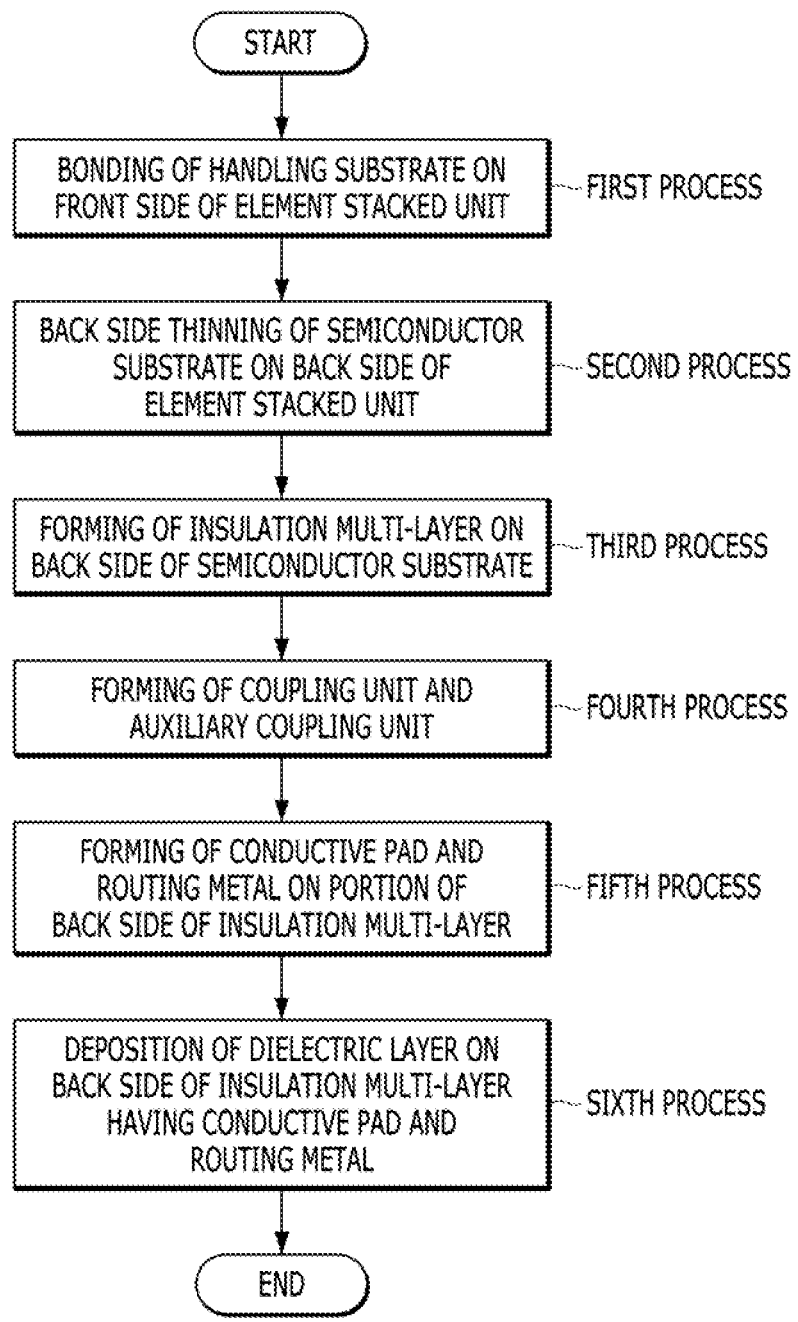
FIG. 4 is a flow chart illustrating a manufacturing process of a backlight image sensor chip having an improved chip driving performance in accordance with an embodiment of the present invention.

FIG. 4 is a flow chart illustrating a manufacturing process of a backlight image sensor chip having an improved chip driving performance in accordance with an embodiment of the present invention. A plurality of backlight image sensor chips having the improved chip driving performance may be manufactured in a wafer.

Firstly, in a first process, the handling substrate 930 is bonded to a front side of the element stacked unit 200. Herein, the first process is performed in a state that the element stacked unit 200 is implemented to include the semiconductor circuit module 210 including the peripheral circuit 211 and the metal distribution line 212, an image sensor module 220 including the photodiode 221 and the metal distribution line 222, and the interlayer insulation layer 230 for an electrical insulation from the semiconductor substrate 100.

Moreover, the first process may be performed in the state that the auxiliary driving unit 700 is included in the element stacked unit 200, and in the state that the first coupling unit 510, which is electrically coupled to the peripheral circuit 211 and the metal distribution line 212 of the semiconductor circuit module 210, and the first auxiliary coupling unit 810, which is electrically coupled to the auxiliary driving unit 700, are implemented.

Next, in a second process, a back side thinning of the semiconductor substrate 100 is performed on the back side of the element stacked unit 200. Herein, the back side thinning of the semiconductor substrate 100 may be performed on the back side of the element stacked unit 200 by depositing a silicon having the thickness of 2-6 μm on the back side of the element stacked unit 200.

Subsequently, in a third process, the insulation multi-layer 300 is formed on the back side of the semiconductor substrate 100. Herein, the insulation multi-layer 300 may be formed on the back side of the semiconductor substrate 100 by forming the anti-reflection layer 310 through the deposition of Oxynitride or Oxide-Nit-Oxide within the thickness of 500 Å on the back side of the semiconductor substrate 100, by depositing the PDM dielectric layer 320 to have the thickness of 1000 Å to 5000 Å on the back side of the anti-reflection layer, and by forming the insulation layer 330 through the deposition of the oxide series material on the back side of the PDM dielectric layer 320.

Next, in a fourth process, the coupling unit 500 and the auxiliary coupling unit 800 are formed. Herein, the coupling unit 500 and the auxiliary coupling unit 8000 may be formed by punching-through a hole for forming of the second coupling unit 500 and the second auxiliary coupling unit 820 through the etching of a portion of the insulation multi-layer 300, and by electrically coupling the first coupling unit 510 and the first auxiliary coupling unit 810 through the second coupling unit 520 and the second auxiliary coupling unit 820, which are formed by burying the tungsten (W).

Subsequently, in a fifth process, the conductive pad 400 and the routing metal 600 are formed on the portion of the back side of the insulation multi-layer 300.

Then, in a sixth process, the dielectric layer 900 is deposited on the back side of the insulation multi-layer 300 on which the conductive pad 400 and the routing metal 600 are formed. Herein, the dielectric layer 900 may be formed by forming the pad open region through the pad open process after the dielectric material of oxide or nitride series is deposited on the back side of the insulation multi-layer 300 such that the conductive pad 400 and the routing metal 600 are buried.

Differently from this, the dielectric layer 900 may be formed by performing the planarization process after the dielectric material of oxide or nitride series is deposited on the back side of the insulation multi-layer 300 such that the conductive pad 400 and the routing metal 600 are buried.

through these implementations, the purpose of the present invention may be accomplished by improving the chip driving performance since an additional function such as an auxiliary power supply, an auxiliary signal transmission and an auxiliary operation control is performed in a backlight image sensor chip having a restricted area without an additional process by using a region, which excludes a pad region in which a conductive pad of a backlight image sensor chip is formed and the sensing region in which the optical filter is formed, as an auxiliary driving region.

Although various embodiments have been described for illustrative purposes, it will be apparent to those skilled in the art that various changes and modifications may be made without departing from the spirit and scope of the invention as defined in the following claims.

What is claimed is:

1. A backlight image sensor having improved chip driving performance, which includes an element stacked unit having a semiconductor substrate, a semiconductor circuit module formed on a front side of the semiconductor substrate, an image sensor module and an interlayer insulation layer, an insulation multi-layer formed on a back side of the semiconductor substrate, a conductive pad formed on a portion of the back side of the insulation multi-layer, and a coupling unit electrically coupled between the conductive pad and the semiconductor circuit module of the element stacked unit, comprising:
   at least one routing metal formed in a region of a same layer as the conductive pad, and being electrically coupled to and directly contacting the conductive pad;
   at least one auxiliary driving unit formed in the element stacked unit or the insulation multi-layer; and
   an auxiliary coupling unit being electrically coupled between the at least one routing metal and the at least one auxiliary driving unit.

2. The backlight image sensor having improved chip driving performance of claim 1, wherein the at least one auxiliary driving unit is at least one auxiliary power line for an auxiliary power supply.

3. The backlight image sensor having improved chip driving performance of claim 1, wherein the at least one auxiliary driving unit is at least one auxiliary signal transmission line for auxiliary signal transmission.

4. The backlight image sensor having improved chip driving performance of claim 1, wherein the at least one auxiliary driving unit is an active element or a passive element for an auxiliary operation control.

5. The backlight image sensor having improved chip driving performance of claim 1, wherein the at least one routing metal is composed of a multi-layer structure, each of the routing metal is electrically coupled to each other through via, and at least one routing metal is electrically coupled to the at least one auxiliary driving unit through the auxiliary coupling unit.

6. The backlight image sensor having improved chip driving performance of claim 1, wherein the insulation multi-layer comprises:
    an anti-reflection layer that is deposited on the back side of the semiconductor substrate;
    a preferential metal deposition (PDM) dielectric layer; and
    an insulation layer stacked on a back side of the PDM dielectric layer.

7. The backlight image sensor having improved chip driving performance of claim 1, further comprising:
    a dielectric layer stacked on a back side of the insulation multi-layer and configured to protect and support the conductive pad and the routing metal.

8. The backlight image sensor having improved chip driving performance of claim 1, further comprising:
    a micro-lens configured to concentrate a light; and
    an optical filter configured to pass a specific frequency band of the light concentrated by the micro-lens.

9. The backlight image sensor having improved chip driving performance of claim 8, further comprising:
    a handling substrate formed on a front side of the element stacked unit.

10. The backlight image sensor having improved chip driving performance of claim 1, wherein the auxiliary coupling unit is directly connected to the at least one routing metal and the at least one auxiliary driving unit.

11. The backlight image sensor having improved chip driving performance of claim 1, wherein the at least one auxiliary driving unit is disposed between the semiconductor circuit module and the image sensor module.

12. The backlight image sensor having improved chip driving performance of claim 1, further comprising:
    a metal shield between the at least one routing metal and an optical filter.

* * * * *